(12) United States Patent
Kledzik et al.

(10) Patent No.: US 6,313,998 B1
(45) Date of Patent: Nov. 6, 2001

(54) CIRCUIT BOARD ASSEMBLY HAVING A THREE DIMENSIONAL ARRAY OF INTEGRATED CIRCUIT PACKAGES

(75) Inventors: Kenneth J. Kledzik; Jason C. Engle, both of San Clemente, CA (US)

(73) Assignee: Legacy Electronics, Inc., San Clemente, CA (US)

( * ) Notice: Subject to any disclaimer, the term of this patent is extended or adjusted under 35 U.S.C. 154(b) by 0 days.

(21) Appl. No.: 09/285,354

(22) Filed: Apr. 2, 1999

(51) Int. Cl.[7] ..................................................... H05K 7/06
(52) U.S. Cl. ........................ 361/767; 361/770; 361/777; 361/782; 257/686; 257/723; 257/724
(58) Field of Search ................................. 361/760, 767, 361/770, 783, 803, 804, 777, 782; 257/685, 686, 723, 724, 777, 778; 438/109

(56) References Cited

U.S. PATENT DOCUMENTS

| | | | | |
|---|---|---|---|---|
| 4,437,235 | * | 3/1984 | McIver | 257/724 |
| 4,956,694 | | 9/1990 | Eide | 257/686 |
| 5,128,831 | | 7/1992 | Fox et al. | 361/735 |
| 5,239,447 | * | 8/1993 | Cotues et al. | 257/686 |
| 5,311,401 | * | 5/1994 | Gates, Jr. et al. | 257/686 |
| 5,313,096 | | 5/1994 | Eide | 257/686 |
| 5,742,097 | * | 4/1998 | Matsunaga et al. | 257/686 |
| 5,744,827 | * | 4/1998 | Jeong et al. | 257/686 |
| 5,754,408 | * | 5/1998 | Derouiche | 257/686 |
| 5,869,353 | | 2/1999 | Levy et al. | 438/109 |
| 6,084,293 | * | 7/2000 | Ohuchi | 257/686 |
| 6,084,780 | * | 7/2000 | Happoya | 361/767 |

\* cited by examiner

*Primary Examiner*—Jeffrey Gaffin
*Assistant Examiner*—John B. Vigushin

(57) ABSTRACT

A circuit board assembly having integrated circuit packages vertically arranged three dimensionally is used to increase electronic component density without increasing the size of the circuit board. For a preferred embodiment of the circuit board assembly, the printed circuit board has at least one primary mounting pad array affixed thereto, each pad of the array having first and second portions. Each lead of a first integrated circuit package is conductively bonded to the first portion of a different mounting pad of said primary array. A package carrier having a plurality of carrier leads attached thereto and a secondary mounting pad array on an upper surface thereof, covers the first package. Each lead of the carrier is coupled to a different pad of the secondary array and is also conductively bonded to the second portion of a different mounting pad of the primary array. Each lead of a second integrated circuit package is conductively bonded to a different mounting pad of the secondary mounting pad array. For a preferred embodiment of the invention, the carrier is provided with embedded lead frame elements which form both the leads and the mounting pads of the carrier. The result is a circuit board assembly having lower component costs, lower assembly costs, and a lower profile than that of the first embodiment assembly.

34 Claims, 8 Drawing Sheets

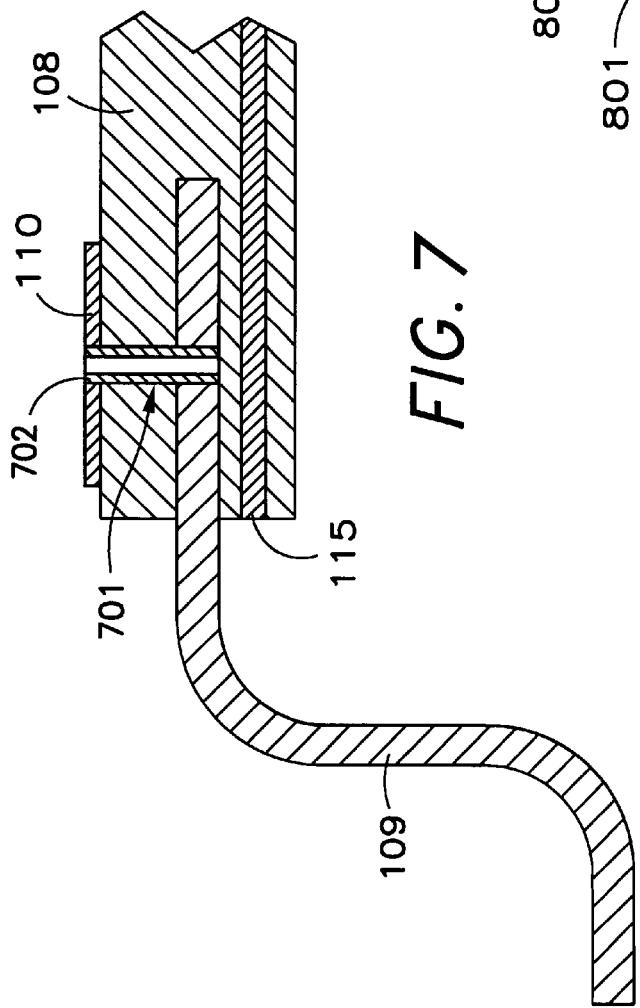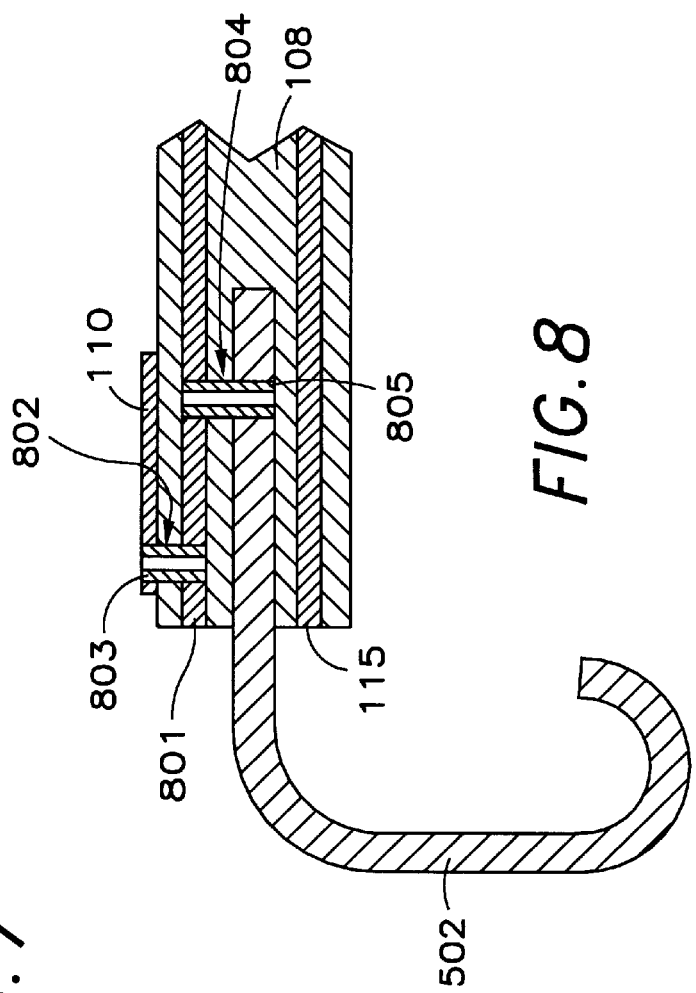

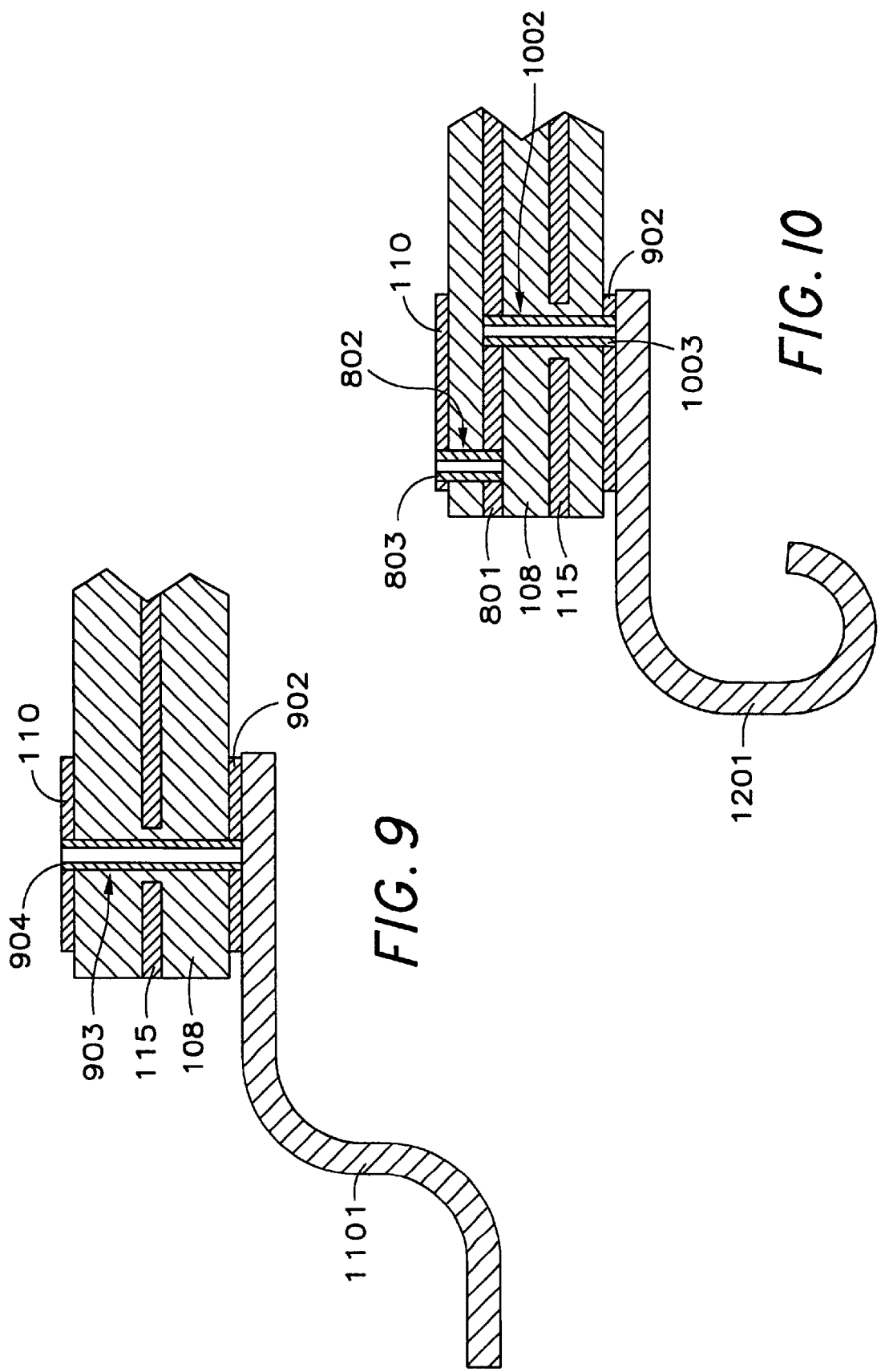

CIRCUIT BOARD ASSEMBLY HAVING A THREE DIMENSIONAL ARRAY OF INTEGRATED CIRCUIT PACKAGES

FIELD OF THE INVENTION

This invention relates to the production of circuit board assemblies and electronic modules, such as memory modules, and more particularly to a method and apparatus for attaching integrated circuit packages to printed circuit boards. It also relates to high-density memory modules having three-dimensional arrangements of integrated circuit packages.

BACKGROUND OF THE INVENTION

Demand for semiconductor memory is highly elastic. When such memory is relatively inexpensive compared to the overall cost of a computer system, an almost unsatiable demand results, with computer manufacturers tending to install an amount of main memory in each system that greatly exceeds the amount required for average program use. On the other hand, when it is costly, manufacturers typically install an amount in each system that only marginally fulfills the requirement of the average program. Although the sales prices of computers may, thus, be maintained at low levels, the end user may soon find that he must upgrade his computer's main memory.

The ever increasing demand for large random access computer memories, and the growing demand for increasingly compact computers, coupled with an incentive on the part of the semiconductor manufactureres to reduce the cost per bit, has lead to not only a quadrupling of circuit density approximately every three years, but to increasingly efficient techniques for packaging and mounting the circuit chips. Up until the late 1980's, semiconductor memory chips were usually packaged as dual in-line pin packages (DIPPs). The pins of these DIPP packages were generally soldered directly within through-holes in a main circuit board (e.g., the motherboard), or they were inserted in sockets which were, in turn, soldered within through-holes in the main circuit board. With the advent of surface mount technology, conventional plated through-holes on printed circuit boards have been replace with conductive mounting pads. Small Outline J-lead (SOJ) packages have lead to Thin Small Outline Packages (TSOPs). Because the pitch or spacing between centers of adjacent surface mount pins is significantly less than the conventional 0.10-inch spacing for conventional through-hole components, surface mount chips tend to be considerably smaller than corresponding conventional chips, thus taking up less space on a printed circuit board. Additionally, as through holes are no longer needed, surface mount technology lends itself to the mounting of components on both sides of a printed circuit board. Memory modules utilizing surface-mount packages on both sides have become the standard. Both the earlier single in-line memory modules (SIMMs) and the currently used dual in-line memory modules (DIMMs) are inserted into sockets on the motherboard.

Packaging density may be increased rather dramatically fabricating modules in which a plurality of integrated circuit (IC) chips, such as memory chips, are stacked in a three dimensional arrangement. As a general rule, the three-dimensional stacking of chips requires complex, non-standard packaging methods.

One example of a vertical stack of IC chips is provided by U.S. Pat. No. 4,956,694 to Floyd Eide, titled INTEGRATED CIRCUIT CHIP STACKING. A plurality of integrated circuits are packaged within chip carriers and stacked, one on top of the other, on a printed circuit board. Except for the chip select terminal, all other like terminals on the chips are connected in parallel.

Another example of chip stacking is given in U.S. Pat. No. 5,128,831 to Fox, et al. titled HIGH-DENSITY ELECTRONIC PACKAGE COMPRISING STACKED SUB-MODULES WHICH ARE ELECTRICALLY INTERCONNECTED BY SOLDER-FILLED VIAS. The package is assembled from individually testable sub-modules, each of which has a single chip bonded thereto. The sub-modules are interleaved with frame-like spacers. Both the sub-modules and the spacers have alignable vias which provide interconnection between the various sub-modules.

U.S. Pat. No. 5,313,096, also issued to Floyd Eide and titled IC CHIP PACKAGE HAVING CHIP ATTACHED TO AND WIRE BONDED WITHIN AN OVERLYING SUBSTRATE, is another example. Such a package includes a chip having an upper active surface bonded to the lower surface of a lower substrate layer having conductive traces on its upper surface which terminate in conductive pads on its periphery. Connection between terminals on the active surface and the traces is made with wire bonds through apertures within the lower substrate layer. An upper substrate layer, which is bonded to the lower substrate layer, has apertures which coincide with those of the lower substrate layer and provide space in which the wire bonding may occur. After wire bonding has occurred, the apertures are filled with epoxy to form an individually testable sub-module. Multiple sub-modules can be stacked and interconnected with metal strips attached to their edges.

A final example of a stacked-chip module is disclosed in U.S. Pat. No. 5,869,353 to A. U. Levy, et al. titled MODULAR PANEL STACKING PROCESS. A plurality of panels are fabricated having apertures therein, an array of chip-mounting pads at the bottom of the apertures, and interfacing conductive pads. Both the chip-mounting pads and the interfacing conductive pads are coated with solder paste. Plastic-encapsulated surface-mount IC chips are positioned on the paste-covered mounting pads, multiple panels are stacked in a layered arrangement and the stack is heated to solder the chip leads to the mounting pads and the interfacing pads of adjacent panels together. Individual chip package stacks are then separated from the panel stack by a cutting and cleaving operation.

As can be seen by the foregoing examples, increased chip density is achieved through the use of complicated packaging and stacking arrangements, which must necessarily be reflected in a higher costs per bit of storage.

SUMMARY OF THE INVENTION

The present invention provides for an improved circuit board assembly having increased chip density. A preferred embodiment of the improved assembly is fabricated with standard plastic-encapsulated, surface-mount IC chips using conventional circuit board assembly techniques. The assembly includes a printed circuit board having at least one primary mounting pad array affixed thereto, each pad of said primary array having first and second portions; a first integrated circuit (IC) package having a package body and a plurality of primary leads attached to the package body, each of which is conductively bonded to the first portion of a different mounting pad of said primary array; a package carrier positioned above the first IC package, the carrier having a carrier body with a package mounting surface thereon, a plurality of carrier leads attached to the carrier body, and a secondary mounting pad array affixed to the package mounting surface, each carrier lead being coupled to a different pad of said secondary mounting pad array, each carrier lead being conductively bonded to the second portion of a different mounting pad of said primary array; and a second integrated circuit package having a plurality of secondary leads, each of which is conductively bonded to a different mounting pad of said secondary array. The first and second IC packages are of identical shape and configuration.

The invention may be utilized to increase memory density on memory modules. For other types of IC packages, it may be employed to more efficiently utilize available real estate on a printed circuit board. In the case of packages containing memory chips, each lead, with the exception of chip select leads, is directly coupled to a corresponding lead on the other package. In order maintain chip select signals separate for each package, the first and second portions of the chip select pad on the first array are not coextensive, but rather are insulated from one another.

Variations of both basic embodiments are possible. For example, the leads of surface mount IC packages may vary. Two types of leads are most commonly used for surface mount components. One lead is "J"-shaped; the other is "S"-shaped. The "S"-shaped leads are becoming increasingly widespread. Other types of leads for surface-mount components may also be developed. The invention should not be considered limited by the type of leads which are utilized on any of the constituent components. Lead types may also be mixed between components. Thus, assemblies having a number of different lead combinations are possible. At one end of the spectrum, both packages and the carrier may utilize "J"-shaped leads. At the other end, all components will use "S"-shaped leads. Between those two extremes, each of the components may utilize either of the two leads currently available for surface-mount components.

DESCRIPTION OF THE DRAWINGS

FIG. 7 is a cross-sectional view through a single embedded lead of a carrier in which direct connection is made between a carrier mounting pad and the lead;

FIG. 8 is a cross-sectional view through a single embedded lead of a carrier in which indirect connection is made between a carrier mounting pad and the lead;

FIG. 9 is a cross-sectional view through a single attached lead of a carrier in which direct connection is made between a carrier mounting pad and the lead; and FIG. 10 is a cross-sectional view through a single attached lead of a carrier in which indirect connection is made between a carrier mounting pad and the lead.

DETAILED DESCRIPTION OF THE INVENTION

As will be evident from the attached drawing figures, the present invention permits the manufacture of circuit board assemblies having increased circuit density. The invention may be used for a variety of applications. One very obvious usage is in the manufacture of memory modules. As memory modules typically incorporate a printed circuit board having rigidly prescribed dimensions, more efficient use of the board real estate will result in a module having greater total memory capacity. The invention may also be utilized to closely couple related, but dissimilar, IC packages. For example, it may be desirable to mount an IC package containing high-speed cache memory on top of an IC package containing a microprocessor chip. The various embodiments of the improved circuit board assembly will now be described in detail with reference to the accompanying drawings.

Figure 1:
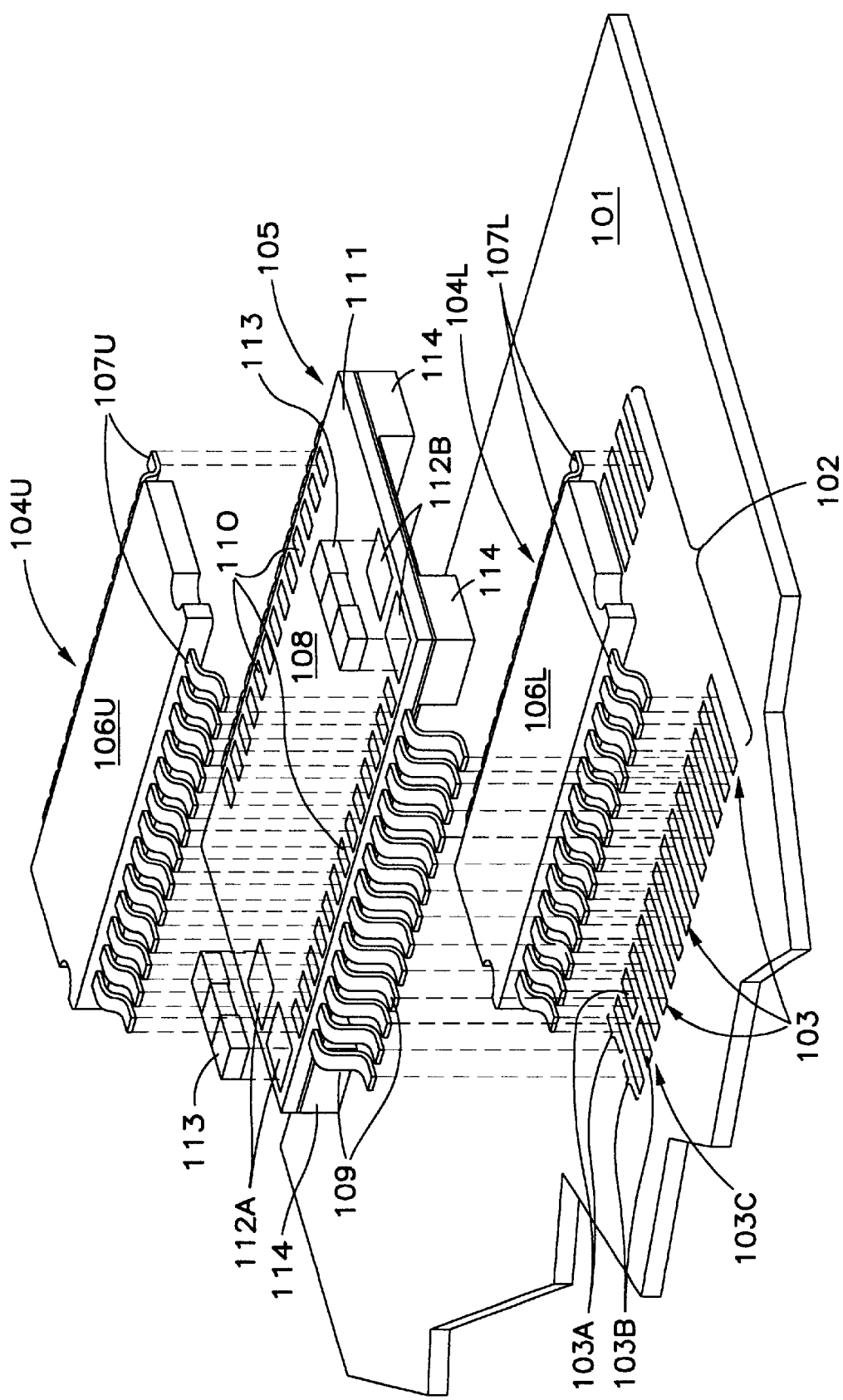
FIG. 1 is an exploded isometric view of a first embodiment of the new multi-chip module in which the carrier has standoffs and both IC packages and the package carrier have "S"-shaped leads.

Referring now to FIG. 1, which shows an exploded component view of a first embodiment of the new circuit board assembly, a laminar printed circuit board 101 is equipped with at least one conductive mounting pad array 102. In this case, the array is arranged in two parallel rows. As with conventional circuit board design, the mounting pads are coupled to conductive traces (not shown) which are routed through various levels in the board. Each mounting pad 103 within array 102 has an inner portion 103A and an outer portion 103B. It will be noted that the inner and outer portions of the next to the last pad 103C on the left row of array 102 are insulated from one another to provide independent chip select signals on each pad portion. This view shows a first IC package 104L is positioned directly above the mounting pad array 102. An IC package carrier I Os is positioned above the first IC package 104L. A second IC package 104U, identical to IC package 104L, is positioned above the carrier 105. Both IC packages 104L and 104U are of the TSOP (Thin Small Outline Package). It should be noted that hereafter, that sub-components of IC package 104L will be labeled with an item number followed by the letter "L", while sub-components of IC package 104U will be labeled with an item number followed by the letter "U". Still referring to FIG. 1, each IC package 104L and 104U has a package body 106L and 106U made of injection-molded plastic material in which is embedded an IC chip (not shown). Each package 104L and 104U has a plurality of leads 107L and 107U. An upper end of each lead 104L and 104U is embedded in the package body 106L and 106U, respectively. As is conventional practice, the embedded end of each lead is coupled to a single bonding pad on the embedded IC chip via one of many available processes such as wire-bonding or ball-bonding. Each exposed end of the leads 107L of the lower IC package 104L is aligned with the inner portion 103A of a mounting pad 103.

Still referring to FIG. 1 the package carrier 105 has a carrier body 108, a plurality of carrier leads 109, and an array of carrier mounting pads 110 on an upper surface 111 of the carrier body 108. The upper surface 111 also incorporates two pair of decoupling capacitor bonding pads 112A and 112B. A decoupling capacitor 113 will be conductively attached to each pair. Each carrier lead 109 is coupled to a single carrier mounting pad 110. The carrier 105 may be fabricated in the same manner used to fabricate plastic encapsulated packages. That is, all interior ends of the carrier leads 109 are embedded within the carrier body 108. The exterior ends of the leads 109 are attached to a lead frame. During a trim and form operation, the frame is removed, thereby singulating and bending each of the leads 109 into the proper final shape. It will be noted that the carrier 105 is equipped with a stand-off tower 114 at each corner. One or more conductive layers 115, which may be a metal such as copper or aluminum, may be held at any potential for impedance control of the active signals of ground. Impedance control may be achieved using either stripline or microstrip structures.

Figure 2:
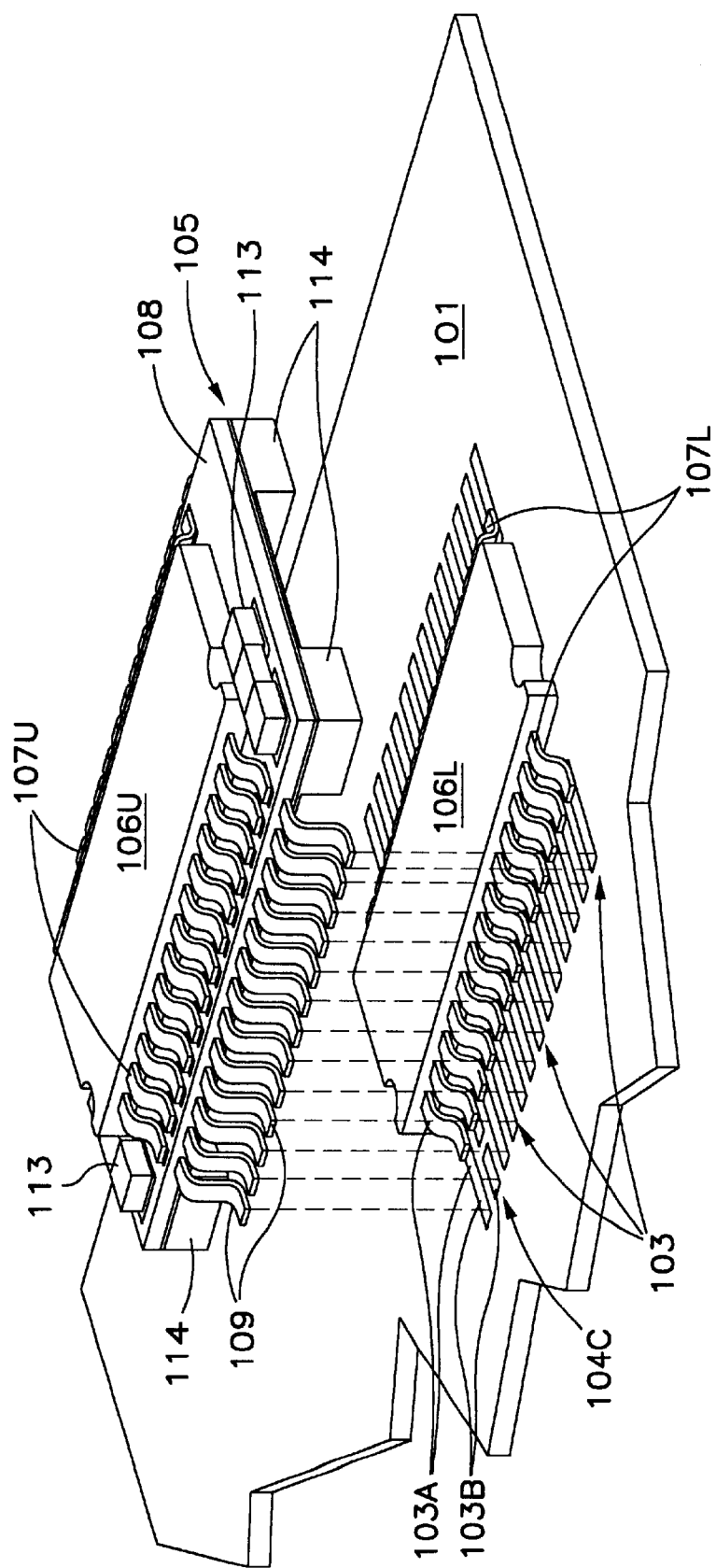
FIG. 2 is an isometric partially-assembled view of the first embodiment of the multi-chip module of FIG. 1.
Figure 3:
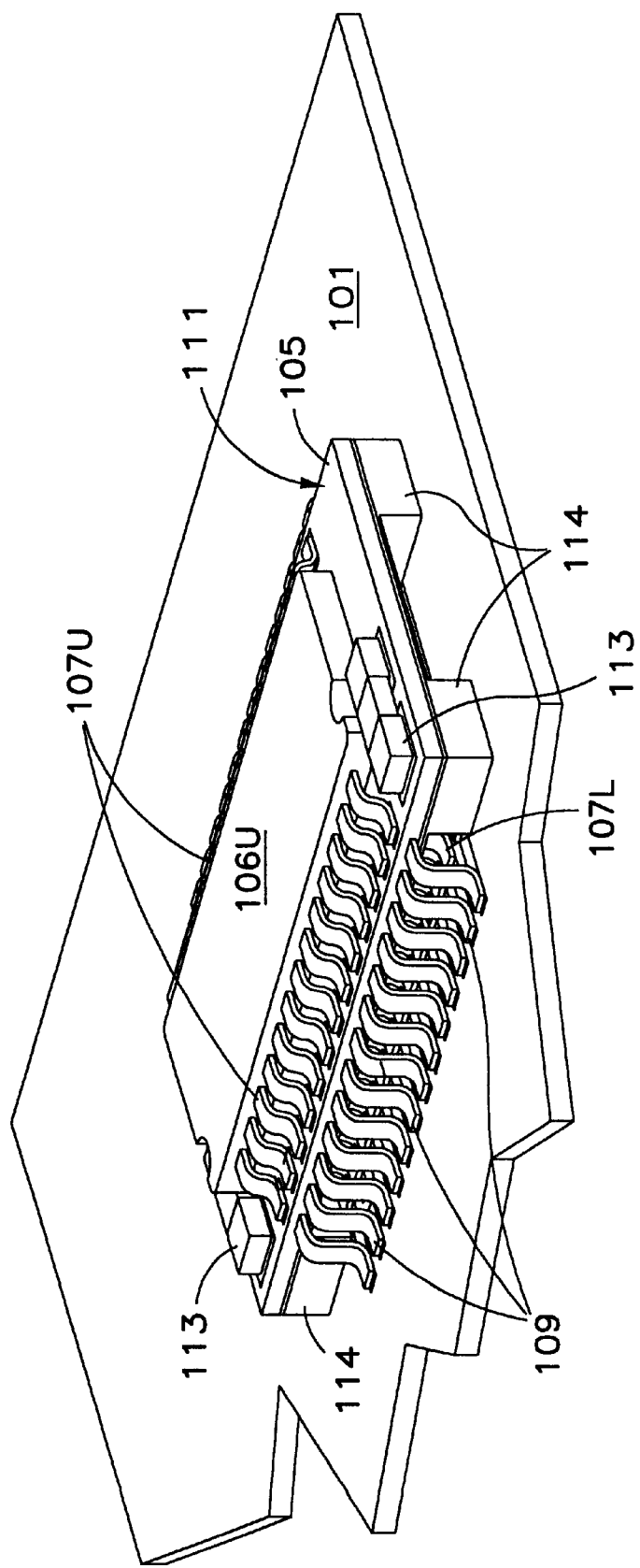
FIG. 3 is an isometric fully-assembled view of the first embodiment of the multi-chip module of FIG. 1.

The circuit board assembly fabrication process is most easily accomplished in a multi-step process. The lower IC package 104L is mounted on the circuit board 101 and the upper IC package and the decoupling capacitors 113 are mounted on the carrier 105. FIG. 2 depicts this stage of component assembly. Finally, the package-laden carrier is mounted on the circuit board on top of the lower IC package 104L. FIG. 3 depicts this final stage of component assembly. Referring now to FIG. 2, the leads 107L off lower IC package 104L have been conductively bonded (e.g., via soldering) to the inner portions 103A of the bonding pads 103 of bonding pad array 102. Likewise, the leads 107U of upper IC package 104U have been conductively bonded to the carrier mounting pads 110 on the upper surface 111 of carrier body 108, and the decoupling capacitors 113 have been conductively bonded to the capacitor bonding pads 112A and 112B.

Referring now to FIG. 3, each of the carrier leads 109 has been conductively bonded (via soldering or conductive epoxy, for example) to the outer portion 103B of a bonding pad 103 of bonding pad array 102. It will be noted that each stand-off tower 114 is sized so that its base mount flush against the upper surface of the circuit board 101 when the carrier leads 109 are soldered to the bonding pads 103. For this embodiment of the carrier, it will also be noted that two IC packages are now mounted on the circuit board 101 using only slightly more board real estate than that required for a single IC package. If the lower and upper IC packages (104L and 104U, respectively) are identical IC memory packages such as synchronous dynamic random access memory (SDRAM), conventional dynamic random access memory (DRAM), or static random access memory, the different chip select signals on the inner and outer portions of bonding pad 103C provide each, of the packages to be accessed individually.

Figure 4:
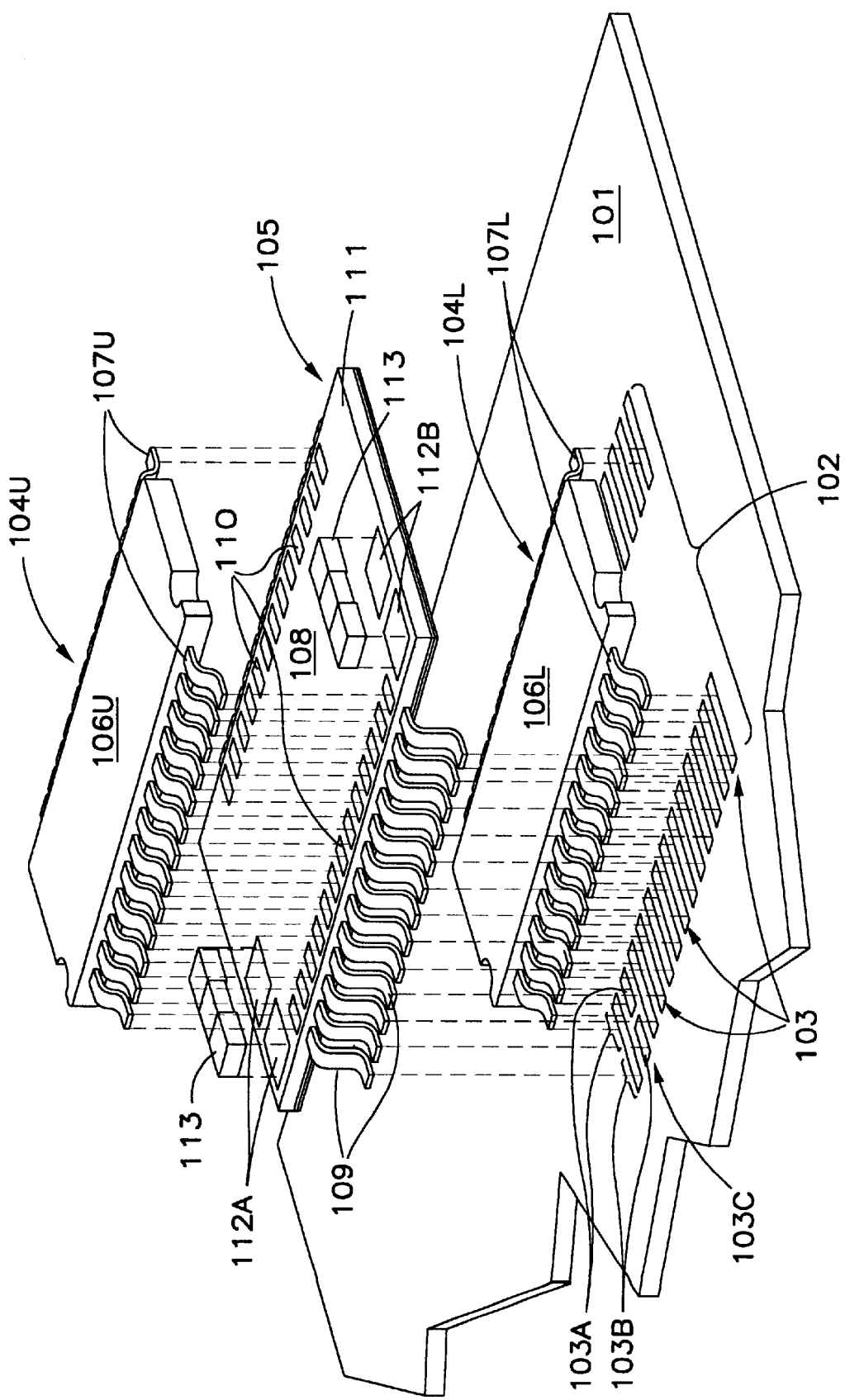
FIG. 4 is an exploded isometric view of a variant of the first embodiment of the new multi-chip module, employing a package carrier having no standoffs.

Referring now to the exploded view of FIG. 4, this variant of the first embodiment circuit board assembly of FIG. 1 lacks the stand-off towers 114. It relies only on the carrier leads 109 for support.

Figure 5:
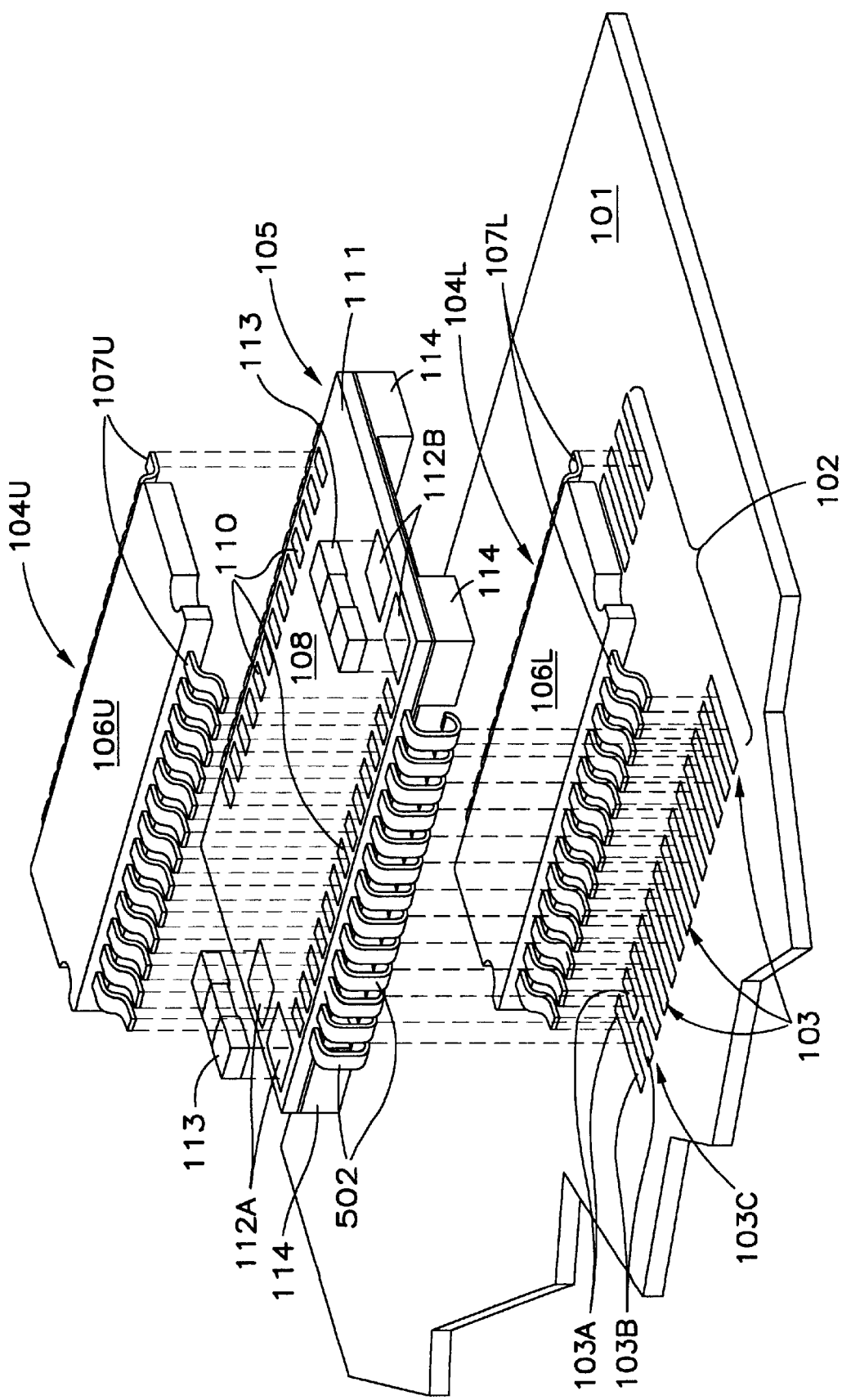
FIG. 5 is an exploded isometric view of a first embodiment of the new multi-chip module in which both IC packages have "S"-shaped leads and the package carrier has "J"-shaped leads.
Figure 6:
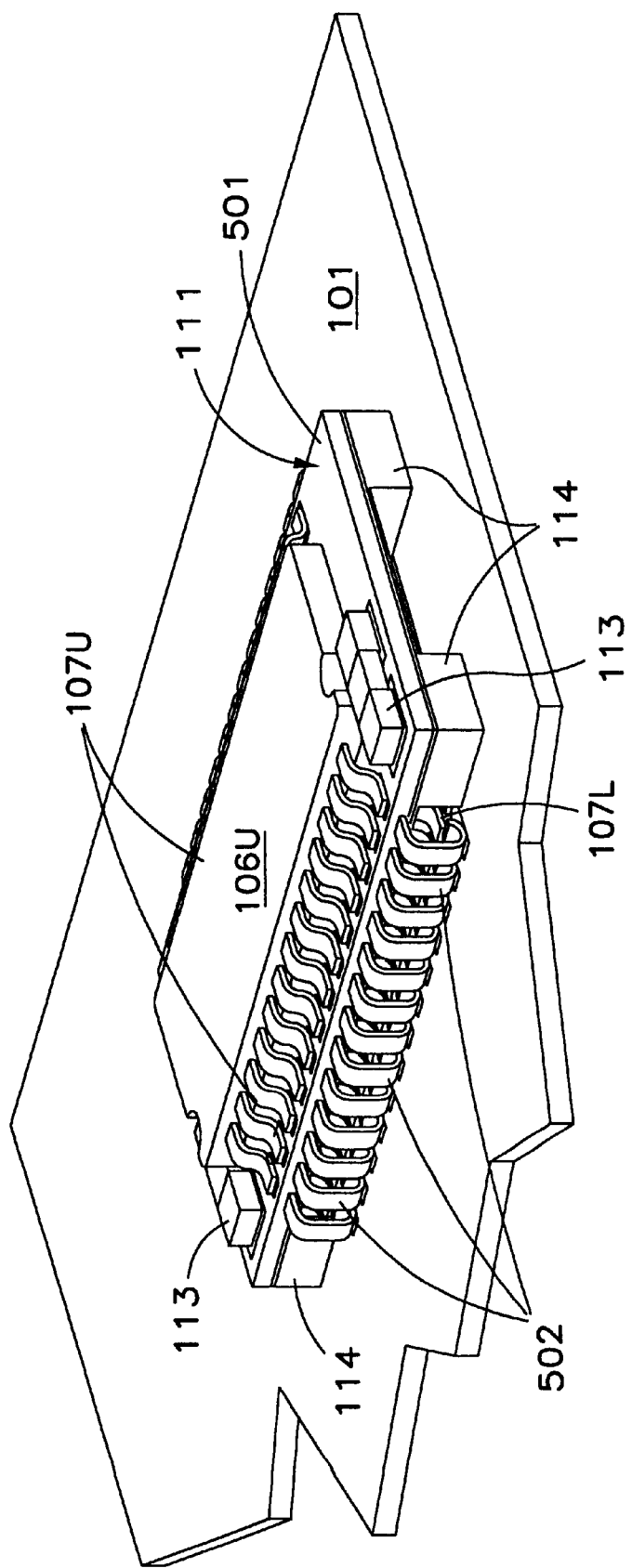
FIG. 6 is an isometric assembled view of the first embodiment of the multi-chip module of FIG. 5.

Referring now to the exploded view of FIG. 5, another variant of the first embodiment of the new circuit board assembly is similar in most respects to the assembly of FIGS. 1, 2 and 3. The primary difference is the package carrier 501, which is equipped with "J"-shaped leads 502, rather than with "S"-shaped leads 109, as on package carrier 105. The "J"-shaped leads allow a slightly narrower mounting footprint for the package carrier 501, as the solderable portion of each lead curves inwardly (i.e., toward the package body), rather than outwardly (i.e., away from the package body). This means that the outer portion 103B of each mounting pad 503 of mounting pad array 504 may be somewhat shorter than the mounting pad array 102 of FIGS. 1, 2 and 3. In all other respects the two assemblies are identical. Therefore, identical items of the two modules share identical item numbers. FIG. 6 shows the module of FIG. 5 in a fully assembled state.

FIGS. 7 through 10 show various carrier designs. The carrier portions of FIGS. 7 and 8 have embedded leads, while those of FIGS. 9 and 10 have leads attached, to a mounting pad. FIG. 7 shows an S-shaped carrier lead 109 which is embedded within a carrier body 108, which may be fabricated from injection molded plastic material. A laminar carrier mounting pad 110, which attached to the carrier body 108, is directly coupled to the lead 109 via a hole 701, which has been plated with a conductive material 702 such as copper. The copper plating makes electrical contact with both the lead 109 and the mounting pad 110. Conductive layer 115 is visible in this view.

In FIG. 8, a conductive routing layer 801, from which conductive traces are formed, provides indirect contact with the mounting pad 110. In this case, the mounting pad 110 is coupled directly to the routing conductive layer 801 via a first hole 802 plated with conductive material 803. The routing conductive layer 801 is, in turn, coupled directly to a J-shaped lead 502 via a second hole 804 plated with conductive material 805. Conductive layer 115 is also visible in this view.

Referring now to FIG. 9, a carrier lead 110 is conductively bonded (e.g., with solder or with a powdered metal filled epoxy) to a lower carrier mounting pad 902. Electrical contact is made to a carrier mounting pad 110, to which a lead of an IC package will be conductively bonded, via a conductively plated hole 903 plated with a conductive material 904. It will be noted that conductive material 904 is insulated from conductive layer 115, which is embedded within the carrier body 108.

Referring now to FIG. 10, electrical connection is made between a carrier mounting pad 110 and a conductive routing layer 801 via a first hole 802 plated with conductive material 803. Electrical connection is made between the routing layer 801 and a lower carrier mounting pad 902 via a second hole 1002 that is also plated with conductive material 1003. It will be noted that conductive material 1003 is insulated from conductive layer 115.

Although only several single embodiments of the invention have been heretofore described, it will be obvious to those having ordinary skill in the art that changes and modifications may be made thereto without departing from the scope and the spirit of the invention as hereinafter claimed. For example, many variations of two basic embodiments are possible. For example, the leads of surface mount IC packages may vary. Two types of leads are most commonly used for surface mount components. One lead is "J"-shaped; the other is "S"-shaped. The "S"-shaped leads are becoming increasingly widespread. Other types of leads for surface-mount components may also be developed. The invention should not be considered limited by the type of leads which are utilized on any of the constituent components. Lead types may also be mixed between components comprising an assembly. Thus, assemblies having a number of different lead combinations are possible. At one end of the spectrum, both packages and the carrier may utilize "J"-shaped leads. At the other end, all components will use "S"-shaped leads. Between those two extremes, each of the components may utilize either of the two leads currently available for surface-mount components.

What is claimed is:

1. A circuit board assembly comprising:

a printed circuit board having at least one principal mounting pad array affixed thereto, each pad of said array having first and second portions, not more than one of said principal mounting pads having noncontiguous first and second portions;

a first integrated circuit package having a plurality of primary leads, each of which is conductively bonded to the first portion of a different mounting pad of said array;

a package carrier having a plurality of carrier leads, each of which is conductively bonded to the second portion of a different mounting pad of said principal mounting pad array, said carrier having an auxilliary mounting pad array thereon, wherein each auxilliary mounting pad can be coupled to a different carrier lead;

a second integrated circuit package having a plurality of secondary leads, each of which is conductively bonded to a corresponding auxilliary mounting pad of said auxilliary mounting pad array; and means for selecting between said first and second integrated circuit packages.

2. The circuit board assembly of claim 1, wherein said first and second integrated circuit packages are identically configured with respect to lead position and function, and wherein corresponding leads of said first and second packages are, generally, electrically coupled to first and second portions, respectively, of the same mounting pads.

3. The circuit board assembly of claim 2, wherein said means of selecting comprises one principal mounting pad having non-contiguous, dielectrically-insulated first and second portions, each portion receiving a different chip select signal for each of said first and second integrated circuit packages.

4. The circuit board assembly of claim 1, wherein both first and second packages are of the TSOP type.

5. The circuit board assembly of claim 1, wherein both first and second packages are of the SOJ type.

6. The circuit board assembly of claim 1, wherein said first and second packages are of dissimilar types, being selected from the group consisting of TSOP and SOJ types.

7. The circuit board assembly of claim 1, wherein said carrier leads and said auxilliary mounting pads are formed from lead frame elements which are partially embedded within said package carrier.

8. The circuit board assembly of claim 1, wherein said carrier is positioned above said first integrated circuit package, and said second integrated circuit package is positioned on an upper surface of said carrier.

9. The circuit board assembly of claim 1, wherein said means for selecting comprises a rerouting of signal inputs to the second integrated circuit package via a routing layer in said package carrier.

10. A circuit board assembly comprising:

a printed circuit board having at least one primary mounting pad array affixed thereto, each pad of said primary array having first and second portions, not more than one of said primary mounting pads having noncontiguous first and second portions;

a first integrated circuit package having a plurality of primary leads, each of which is attached to the first portion of a different mounting pad of said primary array;

a package carrier having a plurality of carrier leads attached thereto and a package mounting surface thereon, said package mounting surface having a secondary mounting pad array attached thereto, wherein each pad of the secondary mounting pad array can be coupled to at least one carrier lead, each carrier lead being attached to the second portion of a different mounting pad of said primary array;

a second integrated circuit package having a plurality of secondary leads, each of which is attached to a different mounting pad of said secondary array; and means for selecting between said first and second integrated circuit packages.

11. The circuit board assembly of claim 10, wherein said first and second integrated circuit packages are identically configured with respect to lead position and function, and wherein corresponding leads of said first and second packages are, generally, electrically coupled to first and second portions, respectively, of the same primary bonding pads.

12. The circuit board assembly of claim 11, wherein said means of selecting comprises one primary mounting pad having non-contiguous, dielectrically-insulated first and second portions, each portion receiving a different chip select signal.

13. The circuit board assembly of claim 10, wherein both first and second integrated circuit packages are of the TSOP type.

14. The circuit board assembly of claim 10, wherein both first and second integrated circuit packages are of the SOJ type.

15. The circuit board assembly of claim 10, wherein said first and second integrated circuit packages have leads of dissimilar types.

16. The circuit board assembly of claim 10, wherein said carrier leads and said secondary mounting pads are formed from lead frame elements which are partially embedded within said package carrier.

17. The circuit board assembly of claim 10, wherein said carrier body is positioned above said first integrated circuit package, and said second integrated circuit package is positioned on an upper surface of said carrier body.

18. The circuit board assembly of claim 10, wherein said means for selecting comprises a rerouting of signal inputs to the second integrated circuit package via a routing layer in said package carrier.

19. A circuit board assembly comprising:

a printed circuit board having at least one primary mounting pad array affixed thereto, said primary array having a center point, each pad of said primary array having inner and outer portions, the inner portion of each pad being nearer said center point than the outer portion of the same pad, not more than one of said primary mounting pads having noncontiguous first and second portions;

a first integrated circuit package having a plurality of primary leads, each of which is conductively bonded to the inner portion of a different mounting pad of said primary array;

a package carrier having a carrier body having a package mounting surface on an upper surface thereof, said package mounting surface having a secondary mounting pad array attached thereto, said carrier body positioned above said first package, said package carrier also having a plurality of carrier leads attached to said carrier body, wherein each carrier lead can be coupled to a different pad of said secondary mounting pad array, each carrier lead being conductively bonded to the outer portion of a different mounting pad of said primary array;

a second integrated circuit package having a plurality of secondary leads, each of which is conductively bonded to a different mounting pad of said secondary array; and means for selecting between said first and second integrated circuit packages.

20. The circuit board assembly of claim 19, wherein said first and second integrated circuit packages are identically configured with respect to lead position and function, and wherein corresponding leads of said first and second packages are, generally, electrically coupled to first and second portions, respectively, of the same primary bonding pads.

21. The circuit board assembly of claim 20, wherein said means of selecting comprises one primary mounting pad having dielectrically insulated first and second portions, each portion receiving a different chip select signal for each of said first and second integrated circuit packages.

22. The circuit board assembly of claim 19, wherein said carrier leads and said secondary mounting pads are formed from lead frame elements which are partially embedded within said package carrier body.

23. The circuit board assembly of claim 19, wherein said means for selecting comprises a rerouting of signal inputs to the second integrated circuit package via a routing layer in said package carrier.

24. A circuit board assembly comprising:
   a printed circuit board having at least one primary mounting pad array affixed thereto, each array having at least first and second parallel rows of spaced-apart primary mounting pads, each primary mounting pad having inner and outer portions, not more than one of said primary mounting pads having noncontiguous inner and outer portions;
   a first integrated circuit package having a first package body in which is embedded a first integrated circuit chip, at least first and second parallel rows of primary electrical leads, each lead having an exposed first portion and a second portion embedded within said first body and electrically interconnected to said first integrated circuit chip, each lead of said first row of primary leads being conductively bonded to the inner portion of a different mounting pad within said first row of primary mounting pads, each lead of said second row of primary leads being conductively bonded to the inner portion of a different mounting pad within said second row of primary mounting pads;
   a package carrier having a carrier body having a package mounting surface, first and second parallel rows of carrier electrical leads attached to said carrier body, each lead of said first row of carrier leads being conductively bonded to the outer portion of a different mounting pad within said first row of primary mounting pads, each lead of said second row of leads being conductively bonded to the outer portion of a different mounting pad within said second row of primary mounting pads, said package carrier also having a secondary mounting pad array affixed to said package-mounting surface, said secondary array having at least first and second parallel rows of spaced-apart secondary mounting pads, wherein each secondary mounting pad can be electrically coupled to a different carrier lead;
   second integrated circuit package having a second package body in which is embedded a second integrated circuit chip, at least first and second parallel rows of secondary electrical leads, each lead having an exposed first portion and a second portion embedded within said second body and electrically interconnected to said second integrated circuit chip, each lead of said first row of secondary leads being conductively bonded to a different pad of said first row of said secondary mounting pads, each lead of said second row of secondary leads being conductively bonded to a different pad of said second row said secondary mounting pads; and
   means for selecting between said first and second integrated circuit packages.

25. The circuit board assembly of claim 24, wherein said first and second integrated circuit packages are identically configured with respect to lead position and function, and wherein corresponding leads of said first and second packages are, generally, electrically coupled to inner and outer portions, respectively, of the same primary bonding pads.

26. The circuit board assembly of claim 25, wherein said means of selecting comprises one primary mounting pad having noncontiguous, dielectrically-insulated inner and outer portions, each portion receiving a different chip select signal for each of said first and second integrated circuit packages.

27. The circuit board assembly of claim 26, wherein dielectrically insulated inner and outer portions of a single primary mounting pad provide separate chip select signals for said first and second integrated circuit packages.

28. The circuit board assembly of claim 24, wherein both first and second packages are of the TSOP type.

29. The circuit board assembly of claim 24, wherein both first and second packages are of the SOJ type.

30. The circuit board assembly of claim 24, wherein said first and second packages are of dissimilar types, being selected from the group consisting of TSOP and SOJ types.

31. The circuit board assembly of claim 24, wherein said carrier leads and said secondary mounting pads are formed from lead frame members which are partially embedded within said carrier body.

32. The circuit board assembly of claim 24, wherein said carrier body is positioned above said first integrated circuit package, and said second integrated circuit package is positioned on an upper surface of said carrier body.

33. The circuit board assembly of claim 24, which further comprises: third and fourth mutually parallel rows of spaced-apart primary mounting pads affixed to said circuit board, said third and fourth rows being perpendicular to said first and second rows, each primary mounting pad within said third and fourth rows having inner and outer portions;
   third and fourth parallel rows of primary electrical leads, said third and fourth rows of primary electrical leads being perpendicular to said first and second rows of primary electrical leads, each lead within said third and fourth rows of primary electrical leads having an exposed first portion and a second portion embedded within said first body and electrically interconnected to said first integrated circuit chip, each lead of said third row of primary leads being conductively bonded to the inner portion of a different mounting pad within said third row of primary mounting pads, each lead of said fourth row of primary leads being conductively bonded to a the inner portion of a different mounting pad within said fourth row of primary mounting pads;
   third and fourth parallel rows of carrier electrical leads attached to said carrier body, each lead of said third row of carrier leads being conductively bonded to the outer portion of a different mounting pad within said third row of primary mounting pads, each lead of said fourth row of leads being conductively bonded to the outer portion of a different mounting pad within said fourth row of primary mounting pads;

third and fourth parallel rows of spaced-apart secondary mounting pads on said secondary mounting pad array, wherein each secondary mounting pad of said first, second, third and fourth rows can be electrically coupled to a different carrier lead; and third and fourth parallel rows of secondary electrical leads, each such lead having an exposed first portion and a second portion embedded within said second body and electrically interconnected to said second integrated circuit chip, each lead of said third row of secondary leads being conductively bonded to a different pad of said third row of said secondary mounting pads, each lead of said fourth row of secondary leads being conductively bonded to a different pad of said fourth row of said secondary mounting pads.

34. The circuit board assembly of claim 24, wherein said means for selecting comprises a rerouting of signal inputs to the second integrated circuit package via a routing layer in said package carrier.

* * * * *